United States Patent
Noguchi

[11] Patent Number: 5,844,282
[45] Date of Patent: Dec. 1, 1998

[54] SEMICONDUCTOR DEVICE HAVING FIELD EFFECT TRANSISTOR CONNECTED AT GATE ELECTRODE TO PROTECTIVE JUNCTION DIODE DISCHARGING IN THE PRESENCE OF LIGHT

[75] Inventor: Ko Noguchi, Tokyo, Japan

[73] Assignee: NEC Corporation, Tokyo, Japan

[21] Appl. No.: 827,250

[22] Filed: Mar. 28, 1997

[51] Int. Cl.[6] .................................... H01L 23/62
[52] U.S. Cl. .......................... 257/356; 257/362
[58] Field of Search .................... 257/355, 356, 257/361, 362

[56] References Cited

U.S. PATENT DOCUMENTS 5,418,383  5/1995  Takagi et al. .............................. 257/48
5,646,433  7/1997  Jimenez .................................. 257/355

FOREIGN PATENT DOCUMENTS 62-102564  5/1987  Japan .
4158578  6/1992  Japan .

Primary Examiner—Ngân V. Ngô
Attorney, Agent, or Firm—Sughrue, Mion, Zinn, Macpeak & Seas, PLLC

[57] ABSTRACT

A gate electrode of a field effect transistor is charged during a plasma process, and a gate oxide layer is liable to be damaged; a protective junction diode is connected to the gate electrode of the field effect transistor, and is radiated with light during the plasma process so as to increase leakage current passing through the p-n junction; the leakage current is increased before the breakdown of the protective junction diode so as to prevent the gate oxide layer from the electric charge, and the breakdown voltage is higher than a test voltage applied to the gate electrode during a diagnosis on the gate oxide layer so that the manufacturer exactly diagnoses the semiconductor device.

5 Claims, 5 Drawing Sheets

SEMICONDUCTOR DEVICE HAVING FIELD EFFECT TRANSISTOR CONNECTED AT GATE ELECTRODE TO PROTECTIVE JUNCTION DIODE DISCHARGING IN THE PRESENCE OF LIGHT

FIELD OF THE INVENTION

This invention relates to a semiconductor device and, more particularly, to a semiconductor device having a field effect transistor connected to a protective junction diode discharging electric charge in the presence of light during a fabrication process.

DESCRIPTION OF THE RELATED ART

While a semiconductor device is being fabricated on a semiconductor substrate, a conductive layer such as a gate electrode of a field effect transistor is unaviodably exposed to a source of electric charge such as a plasma, and electric charge is accumulated in the conductive layer. Such an accumulated electric charge tends to damage an extremely thin gate oxide layer beneath the gate electrode when slowing through it as a charging current. This results in reduction of production yield.

In order to prevent the extremely thin gate oxide from the damage due to the accumulated electric charge, Japanese Patent Publication of Unexamined Application No. 62-102564 proposes to insert a diode between the gate electrode and the semiconductor substrate so as to discharge the accumulated electric charge to the semiconductor substrate.

FIGS. 1 and 2 illustrate the prior art semiconductor device disclosed in the Japanese Patent Publication of Unexamined Application. In order to clearly show the layout of components, an inter-level insulating layer is removed from FIG. 1, and an active area and conductive strips are exposed.

The prior art semiconductor device is fabricated on a p-type silicon substrate 1a, and a field effect transistor 2 is incorporated in the prior art semiconductor device. A p-type well 1b is formed in a surface portion of the p-type silicon substrate 1a, and a field oxide layer 1c is selectively grown on the surface portion of the p-type well 1b. Two surface areas are exposed to openings 1d/1e of the field oxide layer 1c, and are assigned to an active area for the field effect transistor 2 and an n-type impurity region 1f, respectively.

The n-type impurity region 1f forms a p-n junction 1g together with the p-type well 1b, and the p-n junction serves as a protective diode.

The active area assigned to the field effect transistor is covered with a gate oxide layer 2a, and the gate oxide layer 2a is overlain by a gate electrode 2b of polysilicon. N-type source/drain regions 2c/2d are formed in the active area on both sides of the gate electrode 2b. A source electrode 2e is held in contact with the n-type source region 2c through a contact hole 2f, and a drain electrode 2g is held in contact with the n-type drain region 2d through a contact hole 2h. The gate oxide layer 2a, the gate electrode 2b, the n-type source/drain regions 2c/2d, the source electrode 2e and the drain electrode 2g as a whole constitute the field effect transistor 2.

The field effect transistor 2 and the field oxide layer 1c are covered with an inter-level insulating layer 3a, which is removed from the layout shown in FIG. 1. Two contact holes 3b/3c are formed in the inter-level insulating layer 3a, and the n-type impurity region 1f and the gate electrode 2b are exposed to the contact holes 3b/3c, respectively.

An aluminum wiring 4 is formed on the inter-level insulating layer 3a, and are held in contact with the gate electrode 2b and the n-type impurity region 1f through the contact holes 3c/3b. Thus, the gate electrode 2b is electrically connected through the aluminum wiring 4 to the protective diode 1g. The breakdown voltage of the p-n junction 1g is selected in such a manner as to be smaller than the withstand voltage of the gate oxide layer 2a.

Even if the gate electrode 2b is charged during a plasma process after the connection to the protective diode 1g, the protective diode 1g discharges the electric charge before a damage of the gate oxide layer 2a occurs, and prevents the gate oxide layer 2a from serious damage.

However, the prior art semiconductor device encounters a problem in that the protective diode is an obstacle to a diagnosis carried out after completion of the prior art semiconductor device. In detail, a fairly high testing voltage, which is close to the withstand voltage of the gate oxide layer 2a, is applied to the gate electrode 2b during the test so as to examine the reliability of the gate oxide layer 2a. As described hereinbefore during the testing,, the protective diode 1g reaches a breakdown before reaching the withstand voltage of the gate oxide layer 2a. Therefore, the breakdown voltage of the protective diode is very close to the testing voltage, and the protective diode does not allow the manufacturer to check the reliability of the gate oxide layer 2a.

A solution is proposed in Japanese Patent Publication of Unexamined Application No. 4-158578. The Japanese Patent Publication of Unexamined Application proposes to insert a fuse element between a protective diode and a gate electrode liable to be charged. The fuse element propagates undesirable charges from the gate electrode to the protective diode during the fabrication process, and the protective diode prevents the gate oxide layer from damage. The fuse element is disconnected before the test by using a laser beam, and the gate electrode is electrically isolated from the protective diode. As a result, the test voltage is surely applied to the gate electrode without discharging, and the manufacturer can correctly diagnose the reliability of the gate oxide layer.

Thus, the fuse element is effective against the undesirable discharging during the test. However, the radiation of laser beam tends to damage circuit components around the fuse element, and, accordingly, deteriorates the prior art semiconductor device.

SUMMARY OF THE INVENTION

It is therefore an important object of the present invention to provide a semiconductor device which allows a manufacturer to correctly carry out a diagnosis without a damage due to the radiation of laser beam.

The present inventor contemplated the problem inherent in the prior art protective diode, and remembered that light caused leakage current to flow across a depletion layer extending from a p-n junction. The conductive layer such as a gate electrode was charged during a plasma process, and the plasma radiated the light. The present inventor concluded that even if a junction diode had a breakdown voltage higher than a withstand voltage of a gate insulating layer, the light would allow the electric charge and hence the charging current to flow across the p-n junction.

To accomplish the object, the present invention proposes to regulate a gate voltage Vg in a standard use, a test voltage Vtest in the diagnosis, a charge-up voltage Vdis at increase of leakage current, a breakdown voltage of a gate insulating layer Vx and a breakdown voltage Vd of a protective diode to Vg<Vdis, Vtest<Vx, Vd.

In accordance with the present invention, there is provided a semiconductor device fabricated on a substrate, comprising: an electric circuit component formed on the substrate, and including a thin insulating layer formed on a first non-insulating layer and a second non-insulating layer laminated on the thin insulating layer, the thin insulating layer being damaged at a first voltage applied to the second non-insulating layer; a protective diode formed on the substrate, and implemented by a p-n junction between a first semiconductor region of a first conductivity type and a second semiconductor region of a second conductivity type opposite to the first conductivity type, the p-n junction being breakable under a second voltage applied to the first semiconductor region, a depletion layer extending from the p-n junction into the first semiconductor layer and the second semiconductor layer, a leakage current flowing through the depletion layer being larger in quantity than a charging current supplied from a plasma in the presence of a radiation of light supplied from the plasma during a fabrication process of the semiconductor device at a third voltage lower than the first voltage, the thin insulating layer being tested by applying a fourth voltage lower than the second voltage to the second non-insulating layer; an insulating structure transparent to the radiation of light, formed over the electric circuit component and the protective diode, and having contact holes open to the second non-insulating layer and the first semiconductor region; and a third non-insulating layer formed on the insulating structure in such a manner as to allow the radiation of light to reach the p-n junction, and held in contact with the second non-insulating layer and the first semiconductor region through the contact holes.

The electric circuit component may be a field effect transistor.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENTS

First Embodiment

Figure 1:
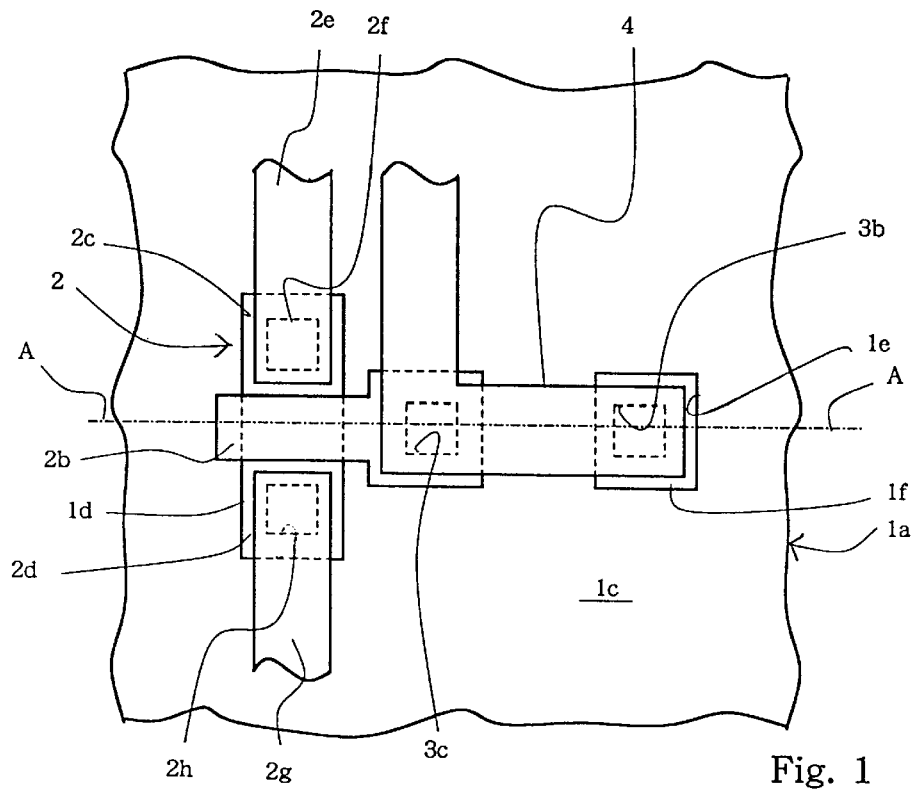
FIG. 1 is a plan view showing the layout of the prior art semiconductor device disclosed in Japanese Patent Publication of Unexamined Application No. 62-102564.
Figure 2:
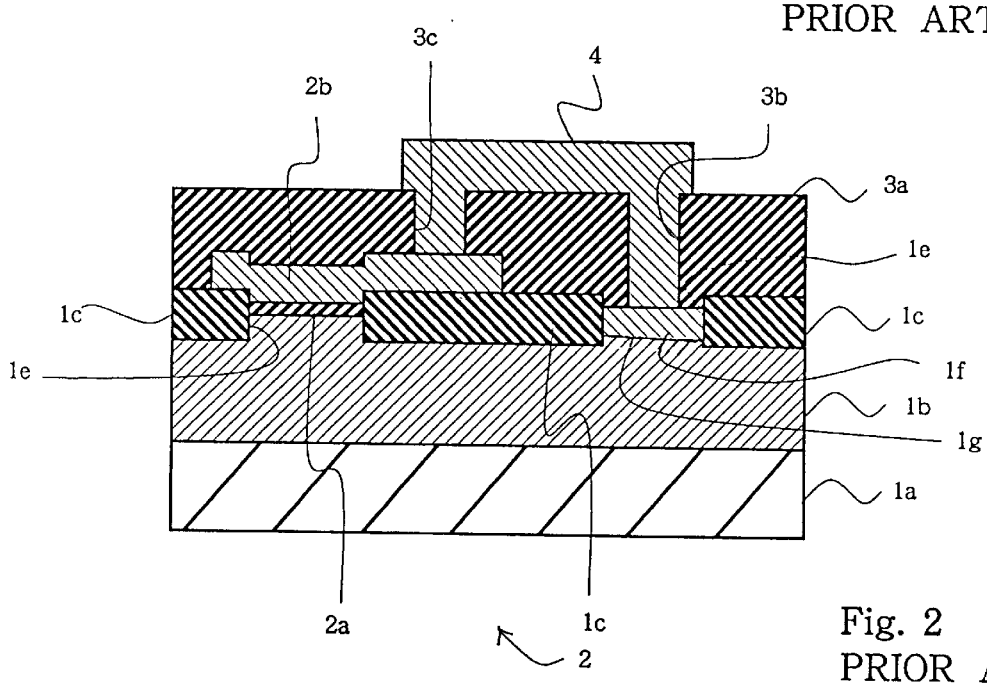
FIG. 2 is a cross sectional view taken along line A—A of FIG. 1 and showing the structure of the prior art semiconductor device.
Figure 3:
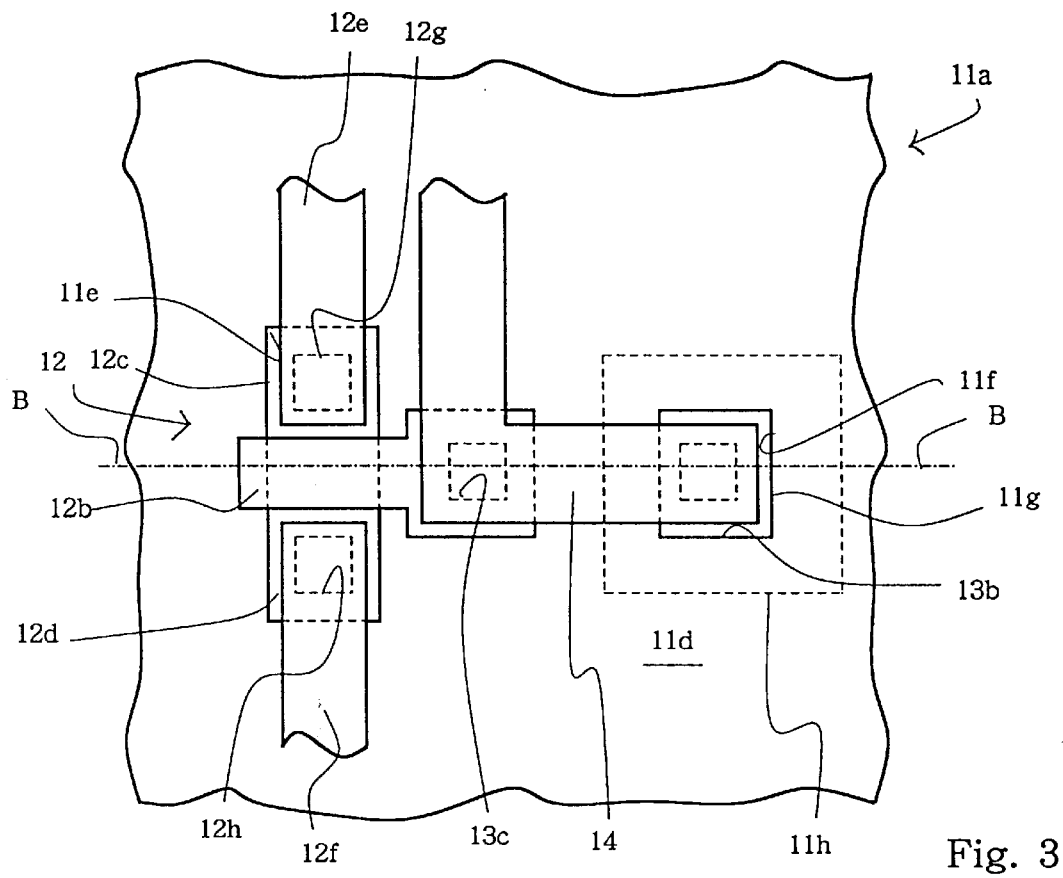
FIG. 3 is a plan view showing the layout of a semiconductor device according to the present invention.
Figure 4:
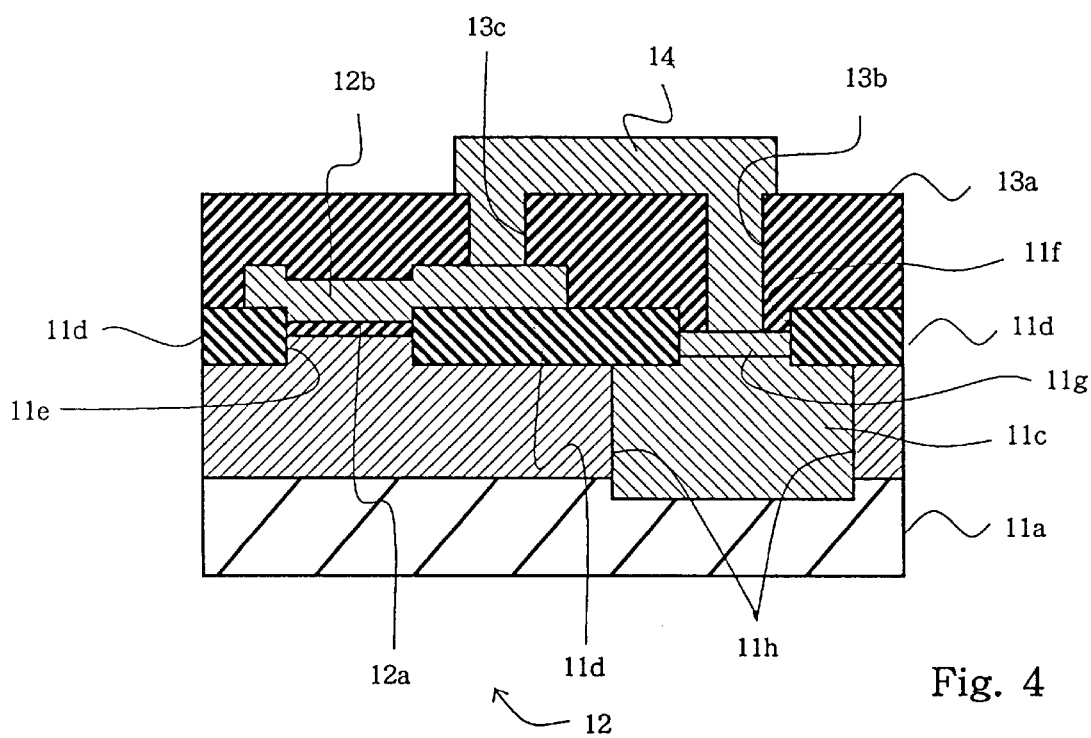
FIG. 4 is a cross sectional view taken along line B—B of FIG. 3 and showing the structure of the semiconductor device.

Referring to FIGS. 3 and 4 of the drawings, a semiconductor device embodying the present invention is fabricated on a p-type silicon substrate 11a. A p-type well 11b is formed in a surface portion of the p-type silicon substrate 11a, and an n-type well 11c is formed in the p-type well 11b. The n-type well 11c is deeper than the p-type well 11b, and penetrates into the p-type silicon substrate 11a. A field oxide layer 11d is selectively grown on a surface portion of the p-type well 11b and a surface portion of the n-type well 11c. The field oxide layer 11d has two openings 11e/11f, and two areas are exposed to the openings 11e/11f, respectively. One of the areas exposed to the opening 11e is assigned to a field effect transistor 12, and the other area is assigned to an n-type impurity region 11g. The n-type impurity region 11g has higher dopant concentration than the n-type well 11c.

The p-type well 11b and the n-type well 11c form a p-n junction 11h therebetween, and the p-n junction 11h serves as a protective diode, which is also labeled with "11h" in the following description. In this instance, the p-type well 11b is doped with p-type dopant impurity at $1 \times 10^{17} \text{cm}^{-3}$ to $3 \times 10^{17} \text{cm}^{-3}$, and the dopant concentration of the n-type well 11c falls within the same range as the p-type well 11b. The breakdown voltage of the protective diode 11h in this example is of the order of 20 volts. The dopant impurity concentrations and, accordingly, the breakdown voltage of the protective diode are varied with the thickness of a gate insulating layer of the field effect transistor 12 and, accordingly, a test voltage applied to the gate electrode in a diagnosis for the reliability of the gate insulating layer as will be described hereinlater.

The area exposed to the opening 11e is covered with a gate insulating layer 12a of, for example, silicon dioxide, and a gate electrode 12b is formed on the area including the gate insulating layer 12a and the field oxide layer 11d. An n-type source region 12c and an n-type drain region 12d are formed in the area on both sides of the gate electrode 12b. A source electrode 12e is held in contact with the n-type source region 12c through a contact hole 12g, and a drain electrode 12f is held in contact with the n-type drain region 12d through a contact hole 12h. The gate insulating layer 12a, the gate electrode 12b, the n-type source region 12c, the n-type drain region 12d, the source electrode 12e and the drain electrode 12f as a whole constitute the field effect transistor 12.

In this instance, the gate insulating layer 12a is equal to or less than 150 angstroms thick, and is damaged under a gate potential of 10 to 15 volts. Thus, the breakdown voltage of the protective diode 11h is larger than the withstand voltage of the gate insulating layer 12a.

The field effect transistor 12 and the field oxide layer 11d are covered with an inter-level insulating layer 13a of silicon oxide, which is removed from the layout shown in FIG. 3 for the sake of simplicity. The silicon oxide is transparent to light. Contact holes 13b and 13c are formed in the inter-level insulating layer 13a, and an aluminum interconnection 14 on the inter-level insulating layer 13a is held in contact with the gate electrode 12b and the n-type impurity region 11g through the contact holes 13c/13b. As will be seen in FIG. 3, most of the p-n junction 11h is uncovered with the aluminum interconnection 14, and the inter-level insulating layer 13a and the field oxide layer 11d allow light to reach the p-n junction 11h.

Figure 5:
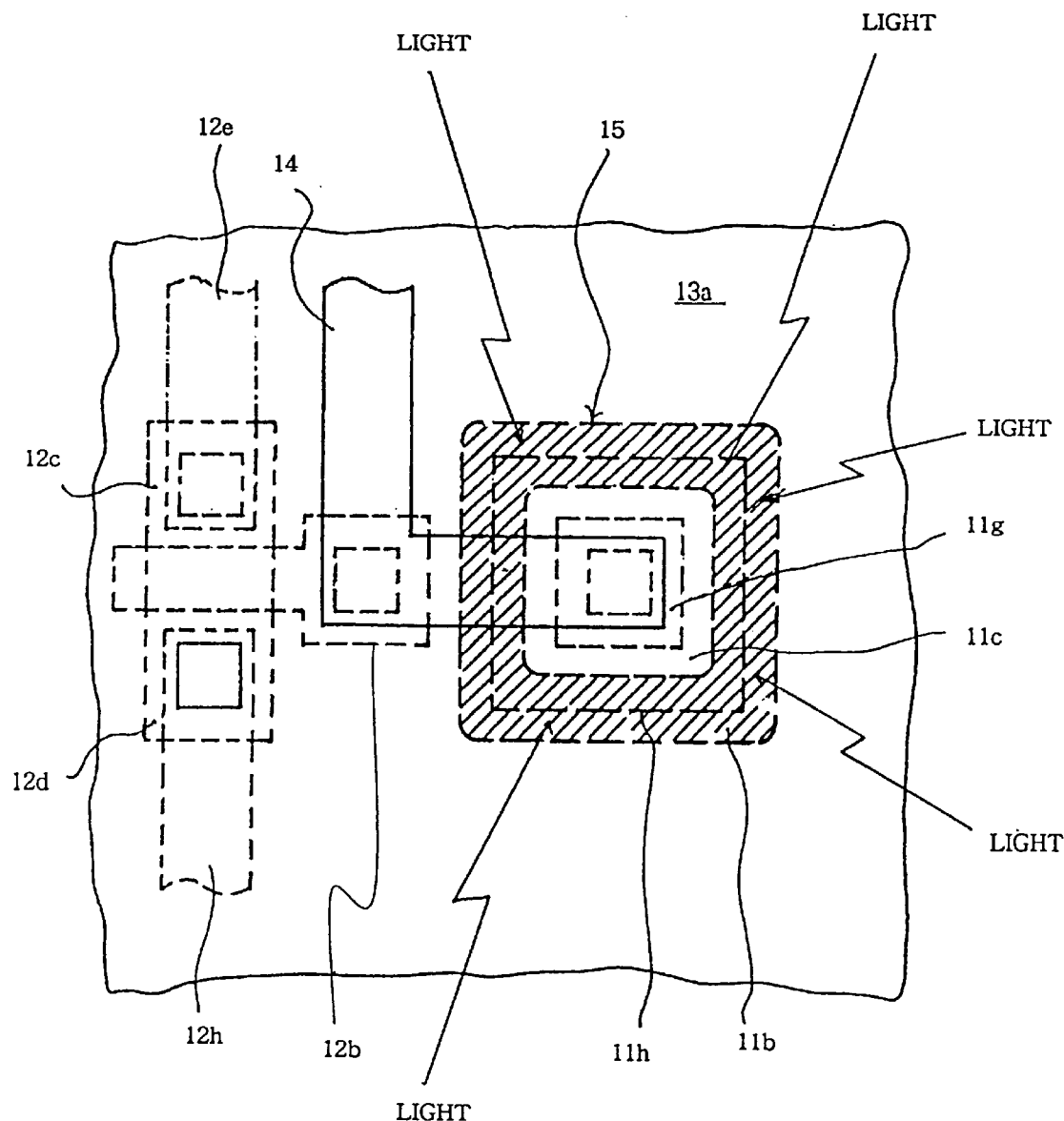
FIG. 5 is a plan view showing a field effect transistor incorporated in the semiconductor device and the gate electrode positively charged.

When the n-type impurity region 11g is positively biased, a depletion layer 15 extends from the p-n junction 11h into the p-type well 11b and the n-type well 11c, and is indicated by hatching lines in FIG. 5. The dopant concentrations of the p-type/n-type wells 11b/11c are so light that the depletion layer 15 was fairly wide.

After the completion of the aluminum interconnection 14, the resultant semiconductor structure may be subjected to a plasma process such as, for example, a plasma-assisted chemical vapor deposition and/or a reactive ion etching. The plasma positively charges the aluminum interconnection 14 and the gate electrode 12b, and the positive electric charge reversely biases the protective diode 11h or the p-n junction 11h, and creates a depletion layer 15. The plasma radiates light, and the light is incident onto the depletion layer 15. The incident light generates a large amount of electron-hole pairs in the depletion layer 15, and recombination current flows as leakage current passing through the depletion layer 15. The amount of leakage current exceeds the amount of charging current supplied from the plasma to the gate electrode 12b about Vdis=5 to 15, which is dependent or the area of the aluminum interconnection and the plasma condition volts. For example, when the gate insulating layer is about 150 angstroms thick, the withstand voltage Vx of the gate insulating layer 12a is of the order of 15 volts, and the leakage current exceeds the charge supply before the withstand voltage Vx. As a result, the gate insulating layer 12a is never damaged.

The gate electrode 12b is often positively charged during the plasma process. Even if the gate electrode 12b is negatively charged, the protective diode 11h is forwardly biased, and the negative electric charge is easily discharged to the p-type silicon substrate 11a.

Upon completion of the semiconductor device, the field effect transistor 12 is subjected to various testing operation. One of the testing operation is carried out for the reliability of the gate insulating layer 12a. The semiconductor device is connected to a testing system (not shown), and the testing system applies a test voltage Vtest of 5 to 15 volts, which is smaller than the breakdown voltage Vd of the protective diode 11h, to the gate electrode 12b. The testing operation is carried out in the absence of light, and the protective diode 11h does not disturb the testing operation. Thus, the protective diode 11h allows the manufacturer to correctly examine the reliability of the gate insulating layer 12a. Moreover, a positive gate voltage Vg at about 5 volts is applied to the field effect transistor 12 in a standard operation after an installation of the semiconductor device into an electric system, and the protective diode 11h does not disturb the operation of the semiconductor device because the breakdown voltage of the protective diode is larger than the operating voltage.

Figure 6:
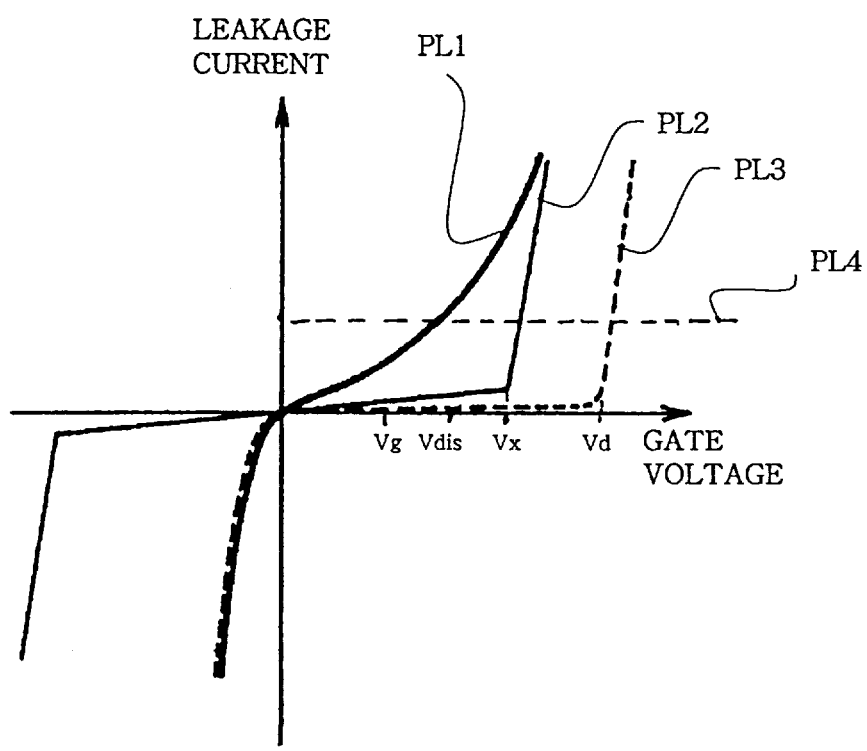
FIG. 6 is a graph showing voltage-to-current characteristics of a protective diode and a gate insulating layer.

The present inventor evaluated the semiconductor device according to the present invention. The present inventor firstly measured the amount of leakage current flowing through the depletion layer 15 in the presence of photoradiation as a function of the gate potential level. The light intensity corresponds to the light radiated from the plasma. The voltage-to-leakage current characteristics were indicated by plots PL1 in FIG. 6.

Subsequently, the present inventor evaluated the gate insulating layer 12a. The gate voltage was gradually increased, and the amount of leakage current passing through the gate insulating layer 12a was measured. The voltage-to-current characteristics were represented by plots PL2, and the present inventor determined the withstand voltage Vx of the gate insulating layer 12a. The withstand voltage Vx was 15 volts.

Finally, the present inventor evaluated the p-n junction or the protective diode 11h. The p-n junction 11h was reversely biased, and the present inventor measured the current passing through the p-n junction 11h. The voltage-to-current characteristics were represented by plots PL3, and the present inventor determined the breakdown voltage Vd of the protective diode 11b at 20 volts.

Thus, the withstand voltage Vx was larger in magnitude than the gate voltage Vdis at which the leakage current exceeded the charging current supplied from the plasma, and the breakdown voltage Vd was larger in magnitude than the test voltage Vtest. The charging current is represented by plots PL4.

As will be appreciated from the foregoing description, the p-n junction 11h discharges the electric charge during the plasma process without a damage of the gate insulating layer 12a, and maintains the test voltage Vtest for a diagnosis. For this reason, it is not necessary to disconnect the interconnection between the field effect transistor 12 and the protective diode 11h before a diagnosis, and the manufacturer improves the reliability of the semiconductor device according to the present invention.

Second Embodiment

Figure 7:
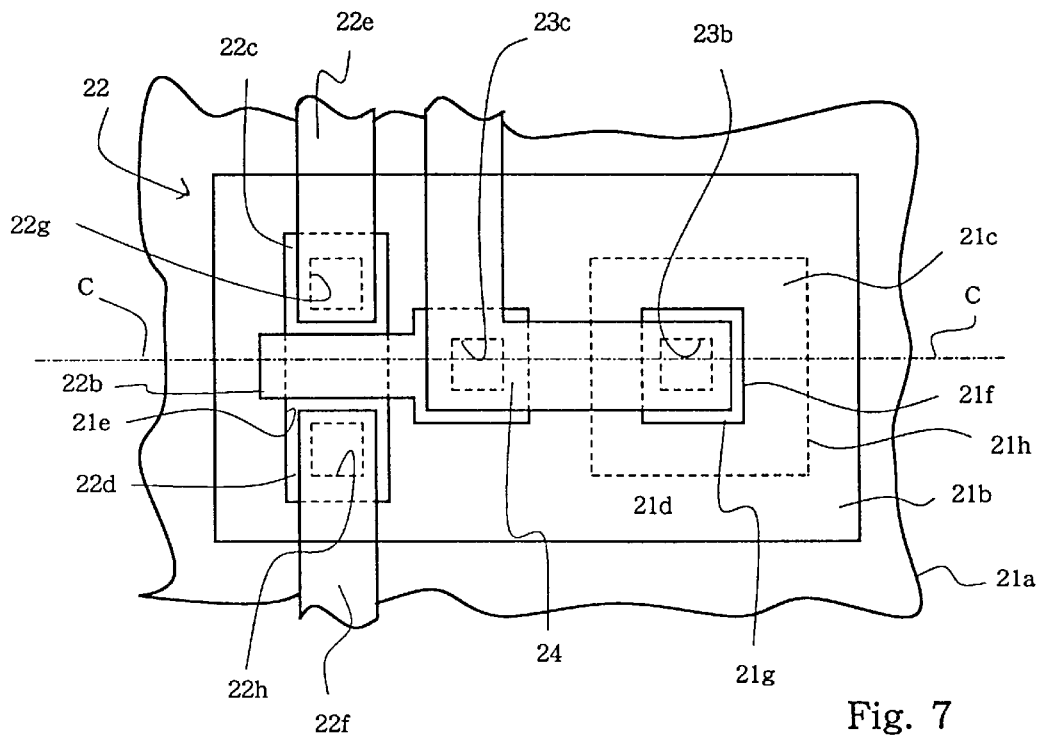
FIG. 7 is a plan view showing the layout of another semiconductor device according to the present invention.
Figure 8:
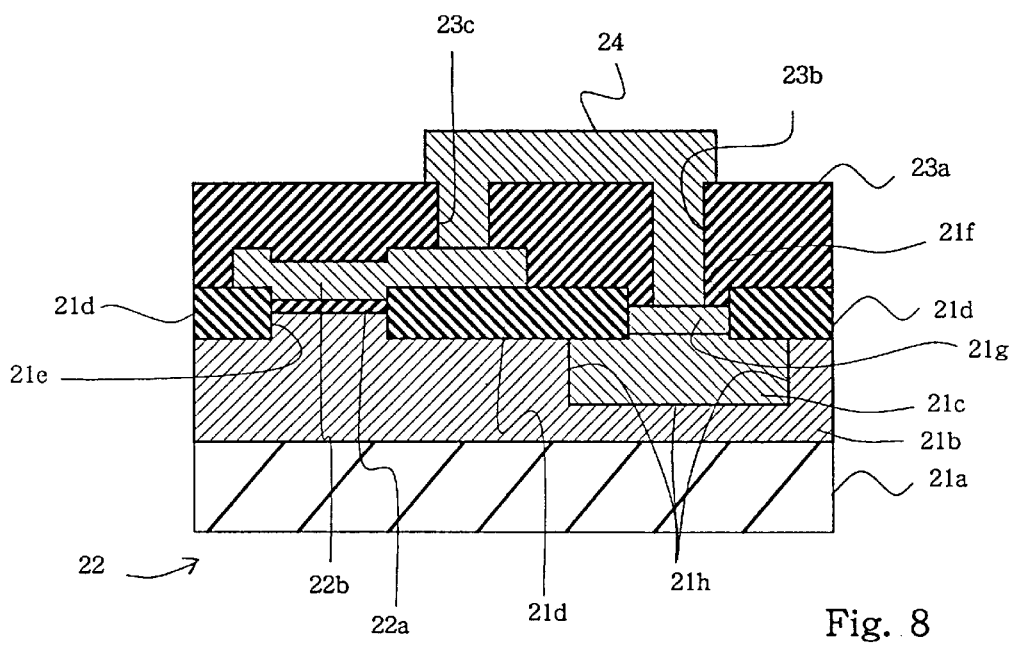
FIG. 8 is a cross sectional view taken along line C—C of FIG. 7 and showing the structure of the semiconductor device.

Turning to FIGS. 7 and 8 of the drawings, another semiconductor device embodying the present invention is fabricated on a p-type silicon substrate 21a. An n-type well 21a is formed in a surface portion of the p-type silicon substrate 21a, and a p-type well 21c is formed in the n-type well 21a. The n-type well 21a is deeper than the p-type well 21c. In this instance, the n-type well 21a and the p-type well 21c are 1 micron in depth and 0.7 micron in depth, respectively. The n-type well 21a and the p-type well 21c may be formed by using an ion-implantation repeated under different acceleration energy.

A field oxide layer 21d is selectively grown on a surface portion of the n-type well 21a and a surface portion of the p-type well 21c. The field oxide layer 21d has two openings 21e/21f, and two areas are exposed to the openings 21e/21f, respectively. One of the areas exposed to the opening 21e is assigned to a field effect transistor 22, and the other area is assigned to a p-type impurity region 21g. The p-type impurity region 21g has higher in dopant concentration than the p-type well 21c.

The n-type well 21a and the p-type well 21c form a p-n junction 21h therebetween, and the p-n junction 21h serves as a protective diode, which is also labeled with "21h" in the following description. In this instance, the n-type well 21a is doped with n-type dopant impurity at $2\times10^{17}\text{cm}^{-3}$, and the p-type well 21c is doped with p-type dopant impurity at $1\times10^{17}\text{cm}^{-3}$. The breakdown voltage of the protective diode 21h in this example is of the order of 20 volts. The dopant impurity concentrations and, accordingly, the breakdown voltage are varied with the thickness of a gate insulating layer of the field effect transistor 22 and, accordingly, a test voltage applied to the gate electrode in a diagnosis for testing the reliability of the gate insulating layer as will be described hereinlater.

The area exposed to the opening 21e is covered with a gate insulating layer 22a of, for example, silicon dioxide, and a gate electrode 22b is formed on the area including the gate insulating layer 22a and the field oxide layer. An n-type source region 22c and an n-type drain region 22d are formed in the area on both sides of the gate electrode 22b. A source electrode 22e is held in contact with the n-type source region 22c through a contact hole 22g, and a drain electrode 22f is held in contact with the n-type drain region 22d through a contact hole 22h. The gate insulating layer 22a, the gate electrode 22b, the n-type source region 22c, the n-type drain region 22d, the source electrode 22e and the drain electrode 22f as a whole constitute the field effect transistor 22.

In this instance, the gate insulating layer 22a is equal to or less than 150 angstroms thick, and merely withstands a gate potential of 10 to 15 volts. Thus, the breakdown voltage of the protective diode 21h is larger than the withstand voltage of the gate insulating layer 22a.

The field effect transistor 22 and the field oxide layer 21d are covered with an inter-level insulating layer 23a of silicon oxide, which is removed from the layout shown in FIG. 7 for the sake of simplicity. Contact holes 23b and 23c are formed in the inter-level insulating layer 23a, and an aluminum interconnection 24 on the interlevel insulating layer 23a is held in contact with the gate electrode 22b and the p-type impurity region 21g through the contact holes 23c/23b. As will be seen in FIG. 7, most of the p-n junction 21h is uncovered with the aluminum interconnection 24, and the inter-level insulating layer 23a and the field oxide layer 21d allow light to reach the p-n junction 21h.

The protective diode 21h behaves as similar to the protective diode 11h. The withstand voltage Vx of the gate insulating layer 22a is higher than a voltage at which the amount of leakage current exceeds the amount of charging current supplied from a plasma to the gate electrode 22b, and the breakdown voltage Vd of the protective diode 21h is higher than a test voltage applied to the gate electrode 22b for testing the reliability of the gate insulating layer 22a. As a result, the semiconductor device shown in FIGS. 7 and 8 also achieves the advantages of the first embodiment.

Although particular embodiments of the present invention have been shown and described, it will be obvious to those skilled in the art that various changes and modifications may be made without departing from the spirit and scope of the present invention. For example, the junction type protective diode according to the present invention may be connected to a capacitor so as to prevent a thin dielectric film from a damage. In this instance, the thin dielectric film may be formed on a conductive material.

What is claimed is:

1. A semiconductor device fabricated on a substrate, comprising:

an electric circuit component formed on said substrate, and including a thin insulating layer formed on a first non-insulating layer and a second non-insulating layer laminated on said thin insulating layer, said thin insulating layer being damaged at a first voltage applied to said second non-insulating layer;

a protective diode formed on said substrate, and implemented by a p-n junction between a first semiconductor region of a first conductivity type and a second semiconductor region of a second conductivity type opposite to said first conductivity type, said p-n junction being breakable under a second voltage applied to said first semiconductor region, a depletion layer extending from said p-n junction into said first semiconductor layer and said second semiconductor layer, a leakage current flowing through said depletion layer being larger in quantity than a charging current supplied from a plasma in the presence of a radiation of light supplied from said plasma during a fabrication process of said semiconductor device at a third voltage lower than said first voltage, said thin insulating layer being tested by applying a fourth voltage lower than said second voltage to said second non-insulating layer;

an insulating structure transparent to said radiation of light, formed over said electric circuit component and said protective diode, and having contact holes open to said second non-insulating layer and said first semiconductor region; and a third non-insulating layer formed on said insulating structure in such a manner as to allow said radiation of light to reach said p-n junction, and held in contact with said second non-insulating layer and said first semiconductor region through said contact holes.

2. The semiconductor device as set forth in claim 1, in which said electric circuit component is a field effect transistor, and said thin insulating layer and said second non-insulating layer are a gate insulating layer and a gate electrode of said field effect transistor.

3. The semiconductor device as set forth in claim 2, in which said field effect transistor is spaced from said protective diode by a field insulating layer transparent to said radiation of light, and said p-n junction is formed under said field insulating layer.

4. The semiconductor device as set forth in claim 2, in which said second semiconductor region is implemented by a p-type silicon well, and said first semiconductor region has an n-type silicon well forming said p-n junction together with said p-type silicon well and an n-type silicon region formed in a surface portion of said n-type silicon well and larger in dopant concentration than said n-type silicon well, said third non-insulating layer being held in contact with said n-type silicon region.

5. The semiconductor device as set forth in claim 2, in which said second semiconductor region is implemented by an n-type silicon well, and said first semiconductor region has a p-type silicon well formed in a surface portion of said n-type silicon well and a p-type silicon region formed in a surface portion of said p-type silicon well larger in dopant concentration than said p-type silicon well, said third non-insulating layer being held in contact with said p-type silicon region.

* * * * *

UNITED STATES PATENT AND TRADEMARK OFFICE
CERTIFICATE OF CORRECTION

PATENT NO. : 5,844,282
DATED : December 1, 1998
INVENTOR(S) : Ko NOGUCHI

It is certified that error appears in the above-identified patent and that said Letters Patent is hereby corrected as shown below:

Column 6, line 24, delete "21a" and insert --21b--;

Column 6, line 26, delete "21a" and insert --21b-- (both occurrences);

Column 6, line 27, delete "21a" and insert --21b--;

Column 6, line 29, delete "21a" and insert --21b--;

Column 6, line 33, delete "21a" and insert --21b--;

Column 6, line 41, delete "21a" and insert --21b--; and

Column 6, line 44, delete "21a" and insert --21b--.

Signed and Sealed this

First Day of June, 1999

Attest:

Q. TODD DICKINSON

Attesting Officer

Acting Commissioner of Patents and Trademarks